United States Patent
Onitsuka et al.

(10) Patent No.: US 10,265,808 B2
(45) Date of Patent: Apr. 23, 2019

(54) FLUX FOR RESIN FLUX CORED SOLDER, FLUX FOR FLUX COATED SOLDER, RESIN FLUX CORED SOLDER AND FLUX COATED SOLDER

(71) Applicant: Senju Metal Industry Co., Ltd., Tokyo (JP)

(72) Inventors: Motohiro Onitsuka, Tochigi-ken (JP); Yoko Kurasawa, Saitama-ken (JP); Toshihisa Kugi, Tochigi-ken (JP); Hiroshi Kawanago, Tochigi-ken (JP); Kaichi Tsuruta, Tochigi-ken (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/971,072

(22) Filed: Dec. 16, 2015

(65) Prior Publication Data

US 2016/0184937 A1    Jun. 30, 2016

(30) Foreign Application Priority Data

Dec. 25, 2014    (JP) .................. 2014-261840

(51) Int. Cl.
| | | |
|---|---|---|
| *B23K 35/36* | (2006.01) | |
| *B23K 35/362* | (2006.01) | |
| *B23K 35/02* | (2006.01) | |
| *H05K 3/34* | (2006.01) | |

(52) U.S. Cl.
CPC ...... *B23K 35/3612* (2013.01); *B23K 35/0227* (2013.01); *B23K 35/0261* (2013.01); *B23K 35/0266* (2013.01); *B23K 35/362* (2013.01); *B23K 35/3613* (2013.01); *H05K 3/3478* (2013.01); *H05K 3/3489* (2013.01); *H05K 2203/0405* (2013.01)

(58) Field of Classification Search
CPC .............. B23K 35/362; B23K 35/0266; B23K 35/3612; B23K 35/0261
USPC ........................................................... 148/23
See application file for complete search history.

(56) References Cited

U.S. PATENT DOCUMENTS

| | | | |
|---|---|---|---|
| 5,116,432 A | 5/1992 | Kerner | |
| 5,272,007 A | 12/1993 | Jenkinson et al. | |
| 6,736,907 B2 | 5/2004 | Taguchi et al. | |
| 2006/0043157 A1 | 3/2006 | Ikeda et al. | |
| 2008/0073000 A1 | 3/2008 | Ikeda et al. | |
| 2008/0115861 A1* | 5/2008 | Ishiga | B23K 35/262 |
| | | | 148/23 |
| 2008/0237301 A1 | 10/2008 | Hirano et al. | |
| 2009/0230175 A1 | 9/2009 | Kawashiro | |
| 2010/0252144 A1 | 10/2010 | Ishikawa et al. | |

FOREIGN PATENT DOCUMENTS

| | | |
|---|---|---|
| CN | 101003111 A | 7/2007 |
| CN | 102785039 A | 11/2012 |
| CN | 104010308 A | 10/2014 |
| EP | 1317991 A2 | 6/2003 |
| EP | 2223771 A1 | 9/2010 |
| GB | 2071550 A | 9/1981 |
| JP | 2008100279 A | 5/2008 |
| JP | 2009246356 A | 10/2009 |
| JP | 2009255153 A | 11/2009 |
| JP | 2012016737 A | 1/2012 |
| JP | 2013086177 A | 5/2013 |
| WO | 01070449 A1 | 9/2001 |

* cited by examiner

*Primary Examiner* — Weiping Zhu
(74) *Attorney, Agent, or Firm* — The Webb Law Firm

(57) ABSTRACT

A flux for a resin flux cored solder contains 30% or more by mass but 80% or less by mass rosin ester and 5% or more by mass but 15% or less by mass activator. The total content ratio of base materials including the rosin ester is preferably equal to or more than 85% by mass but equal to or less than 95% by mass.

4 Claims, No Drawings

FLUX FOR RESIN FLUX CORED SOLDER, FLUX FOR FLUX COATED SOLDER, RESIN FLUX CORED SOLDER AND FLUX COATED SOLDER

CROSS REFERENCE TO RELATED APPLICATION

This application claims priority to Japanese Patent Application No. 2014-261840 filed Dec. 25, 2014, the disclosure of which is hereby incorporated in its entirety by reference.

BACKGROUND OF THE INVENTION

Field of the Invention

The present invention relates to a flux used for a resin flux cored solder, a flux used for a flux coated solder having its surface coated with a flux, a resin flux cored solder using a flux, and a flux coated solder.

Description of Related Art

A resin flux cored solder is a material wherein a wire solder is filled with a solid flux. A flux coated solder is a material wherein a wire solder is coated with a flux. A flux used for a soldering eliminates chemically a metallic oxide from a metallic surface of an object to be soldered at a soldering process in order to make metallic elements possible to move at a boundary therebetween. By employing the flux, it forms a metallic compound between the solder and the metallic surface of the object to be soldered for establishing a strong joint.

The flux requires characteristics, such as elimination of the metallic oxide, prevention of a reoxidation at a solder fusion, a lower surface tension of the solder, etc. When using such a flux for the resin flux cored solder or the flux coated solder, the flux comprises an activator for improving a wettability of the metallic surface by eliminating an oxidized film therefrom and a base material, such as rosin, etc. for protecting the activator from heat. Japanese Patent Application Publication No. 2008-100279 discloses that a rosin resin, such as a rosin ester, etc. is used as a base resin (corresponding to a base material of the present invention that will be described hereinafter) and it is added to the flux for the resin flux cored solder where its amount is within a range of 3-60% by weight, preferably 5-50% by weight.

In general, the flux contains components that volatilizes as a result of heat at the soldering operation. The volatilized components gather to form air bubbles. When the air bubbles blow out, the flux and the solder may fly apart. Japanese Patent Application Publication No. 2012-016737 discloses a flux composition that inhibits the gas from releasing intensively from the flux by generating a lot of extremely fine air bubbles in the flux for the micro degassing.

A part of the components volatilized by the heat during the soldering changes a visible white smoke. If the generated white smoke fills the factory and the like having an especially insufficient exhaust equipment, problems occur wherein it is hard to work for workers and their work efficiency may be reduced.

The flux disclosed in Japanese Patent Application Publication No. 2008-100279 does not take measure to resolve the above described problems. The flux composition disclosed in Japanese Patent Application Publication No. 2012-016737 does not focus on reducing an amount of the generated gas.

SUMMARY OF THE INVENTION

Therefore, the present invention solves these problems. An object of the present invention is to provide a flux for a resin flux cored solder, a flux for a flux coated solder flux, a resin flux cored solder flux and a flux coated solder, which inhibit the white smoke from generating.

The inventors found out that it is effective to use rosin ester as a base material for inhibiting the white smoke from generating. In addition, the inventors found out that the flux could inhibit the white smoke at the soldering operation, keep the sufficient wettability of the solder for the working and prevent the raw material from being precipitated during the flux manufacturing by adding the activator and other base materials to the rosin ester.

The flux for the resin flux cored solder according to the present invention contains 30% or more by mass but 80% or less by mass rosin ester and 5% or more by mass but 15% or less by mass activator. The total amount of the base materials including the rosin ester in the flux for the resin flux cored solder is equal to or more than 85% by mass but equal to or less than 95% by mass.

The resin flux cored solder according to the present invention is a resin flux cored solder wherein a wire solder is filled with the flux. The flux contains 30% or more by mass but 80% or less by mass rosin ester and 5% or more by mass but 15% or less by mass activator. The total amount of the base materials including the rosin ester is equal to or more than 85% by mass but equal to or less than 95% by mass.

The flux for the flux coated solder according to the present invention contains 30% or more by mass but 80% or less by mass rosin ester and 5% or more by mass but 15% or less by mass activator. The total amount of the base materials including the rosin ester in the flux for the flux coated solder is equal to or more than 85% by mass but equal to or less than 95% by mass.

The flux coated solder according to the present invention is a flux coated solder wherein a wire solder coated by the flux. The flux contains 30% or more by mass but 80% or less by mass rosin ester and 5% or more by mass but 15% or less by mass activator. The total amount of the base materials including the rosin ester is equal to or more than 85% by mass but equal to or less than 95% by mass.

According to the flux for the resin flux cored solder and the flux for the flux coated solder, they can inhibit the white smoke at the soldering operation. Therefore, the invention can prevent the room inside being filled with the white smoke so that the workers can execute efficiently the soldering work. The flux for the resin flux cored solder and the flux for the flux coated solder according the present invention do not prevent the wettability of the solder so that the solder defect can be suppressed. Since the invention can inhibit the raw material from being precipitated in the flux during the flux manufacturing, it can prevent the defect when filling the flux in the solder.

DESCRIPTION OF THE PREFERRED EMBODIMENTS

The flux for the resin flux cored solder according to an embodiment of the present invention will be described hereinafter. However, the present invention is not limited only to the following embodiment.

[Composition Example of Flux for Resin Flux Cored Solder]

The flux according to the embodiment of the present invention contains rosin ester that is hard to volatilize at the soldering temperature and can inhibit the white smoke from generating. The rosin ester can inhibit the white smoke but affects the wettability and precipitation of the solder. Therefore, it contains the activator for improving the wettability of the solder and other base materials for inhibiting the precipitation of the raw materials during the flux manufacturing.

The rosin ester may be, for example, the esterified rosin, such as hydrogenated rosin, acid modified rosin, polymerized rosin, etc.

The other base materials may be, for example, resin or the like that is hard to volatilize at the soldering temperature. Such resin is preferably one of the hydrogenated rosin, acid modified rosin, polymerized rosin, wax, high molecular compound and fatty acid ester or a combination thereof. However, the other base materials are not limited to them.

The activator is preferably one of halogen activator, organic acid and imidazole or a combination of them. The flux for the resin flux cored solder according to the present invention is used in a solid form. However, the flux may contain one of thixotropic agent, solvent and surface active agent or a combination thereof within a range of not affecting the inhibition of the white smoke as the advantage of the present invention.

The embodiment of the present invention uses the resin flux cored solder and the flux coated solder employing these fluxes.

[Testing Method]

In this example, the inventors conducted the following test by using the resin flux cored solder in order to establish amounts of the rosin ester, the other base materials and the activator. First, the inventors made up the flux for the resin flux cored solder in accordance with ratios shown in Table 1 (that will be described hereinafter) and applied it to the solder having an alloy composition of Sn-3Ag-0.5Cu (wherein the numbers in the solder composition indicate % by mass). Then, the inventors conducted a test of a white smoke amount, a wetting extendability test for evaluating the wettability and a precipitation test of the raw materials for each embodiment and a comparison example by using the resin flux cored solder. The sum of the composition amounts of the rosin ester and the other base materials is the amount of the base materials. The composition ratio in Table 1 is % by mass.

(1) Amount Test of White Smoke

The following is a process that the inventors conducted the test of the white smoke amount for the resin flux cored solder to which the above described flux was filled.

1. The inventors prepared a soldering iron, resin flux cored solders, a solder feeding device and a camera. The solder iron was manufactured by Hakko Corporation in Osaka, Japan, its main unit was FX-951, a main body of the soldering iron was FM2028, and a tip of the soldering iron was T12-C4 C-cut φ4 mm. Each example of the resin flux cored solders had a 0.8-mm wire diameter and its flux amount was adjusted to 3% with respect to a total weight of the resin flux cored solder.

2. The inventors set up the resin flux cored solder at the solder feeding device, set a temperature of the soldering tip to 380° C., fed the resin flux cored solder to the solder tip at a speed of 20 mm/s for 10 seconds in order to heat the solder.

3. The inventors provided a black cloth (for example, velvet) at a background of a position for observing the white smoke and recorded a video of the generating white smoke by using the camera.

4. The inventors picked up as still images an image 1 when the resin flux cored solder touched the tip of the soldering iron and an image 2 when three seconds passed after the touch wherein a resolution of the still image was 640×480.

5. The inventors trimmed extra objects in the image 1 from the image 2 to get the image of only white smoke by using an image software AT-Image. Then, the inventors divided brightness levels of each pixel into 256 levels consisting of 0 to 255, obtained the number of pixels for each brightness level, and deleted the pixels having the 0-19 brightness levels as noise. Then, the inventors calculated products by multiplying each brightness level by the corresponding number of the pixels. A sum of the all the calculated values was assumed as the generation amount K of the white smoke.

In the test of the white smoke amount, a distance between the camera and the soldering iron is a distance enough for a fact that all white smoke is taken in the image. A preferred distance is that the white smoke is located within about 80% of the picked still image in a vertical direction. It is required that the measurement condition of each measurement is the same as each other.

In the above discussed test of the white smoke amount, the generation amount value of the white smoke differs in accordance with the used camera and the measurement condition. Therefore, the inventors measured the generation amount $K_0$ of the white smoke by using the resin flux cored solder having the flux of 100% rosin ester and calculated a generation ratio $K/K_0$ of the white smoke in order to stop a gap based on the measurement condition.

In Table 1 of the white smoke amount test, "O" represents that the generation ratio of the white smoke is 6 or less and "X" represents the generation ratio of the white smoke is more than 6.

When a large amount of the white smoke is generated during the soldering operation and the room is filled with the white smoke, the efficiency of the soldering work is decreased. On the hand, when the amount of the generated white smoke is small, the worker can execute the soldering work effectively.

(2) Test of Wetting Extendability

In the next stage, the inventors conducted the test of the wetting extendability of the resin flux cored solder filled with the flux as follows. In this test of the wetting extendability, a solder extendability ratio S (%) was measured in accordance with JIS Z-3197 8.3.1.1.

1. A test sample was 0.3+/−0.03 g of the resin flux cored solder that was put in a spiral shape on a copper oxide plate having 0.3 mm thickness and 30 mm×30 mm size.

2. The sample was held to be heated by a solder bath (or a hot plate) having a temperature of 250° C. for 30 seconds after the start of melting the solder.

3. After removing from the heating source, the solder was solidified by cooling it to an ambient temperature. After washing the flux residues, a height of the solder was measured by using a micrometer.

4. Assuming that the height was H (mm) and its diameter was D (mm) by regarding the tested solder as a sphere, the solder extendability ration S (%) was measured by using the following equation 1.

$$S=[(D-H)/D]\times 100 \qquad \text{Equation 1:}$$

In the table of the wetting extendability test, "O" represents that S is 77.0% or more and "X" represents that S is less than 77.0%. If the flux having a bad wettability is used for the solder, a soldering defect, such as void and the like, tends to take place. If the flux having a good wettability is used for the solder, the soldering defect hardly takes place.

(3) Precipitation Test of Raw Materials (Existence or Non-existence of the Precipitation)

Then, the inventors conducted the precipitation test during the flux holding. The inventors held the manufactured flux in a thermostatic oven having a temperature of 130° C. and observed the existence or non-existence of the flux turbidity with the naked eye after two hours passed.

In the table of the precipitation text for the raw material, "O" represents that there is no precipitation of the raw material and "X" represents that there is precipitation. The precipitation of the raw material causes the defect when the solder is filled with the flux. If there is no precipitation of the raw material, the solder can be filled appropriately with the flux.

The following Table 1 shows the amount test of the white smoke, the wetting extendability test and the precipitation test of the raw material. Each test result will be explained by reference to Table 1.

TABLE 1

| Embodiment 1 | |
|---|---|
| 1: rosin ester (%) | 30 |
| 2: the other base material (%) | 55 |
| base material (1 + 2) (%) | 85 |
| activator | 15 |
| amount test of white smoke | O |
| wetting extendability test | O |
| existence or no-existence of precipitation | O |
| Embodiment 2 | |
| 1: rosin ester (%) | 30 |
| 2: the other base material (%) | 65 |
| base material (1 + 2) (%) | 95 |
| activator | 5 |
| amount test of white smoke | O |
| wetting extendability test | O |
| existence or no-existence of precipitation | O |
| Embodiment 3 | |
| 1: rosin ester (%) | 35 |
| 2: the other base material (%) | 55 |
| base material (1 + 2) (%) | 90 |
| activator | 10 |
| amount test of white smoke | O |
| wetting extendability test | O |
| existence or no-existence of precipitation | O |
| Embodiment 4 | |
| 1: rosin ester (%) | 40 |
| 2: the other base material (%) | 50 |
| base material (1 + 2) (%) | 90 |
| activator | 10 |
| amount test of white smoke | O |
| wetting extendability test | O |
| existence or no-existence of precipitation | O |
| Embodiment 5 | |
| 1: rosin ester (%) | 50 |
| 2: the other base material (%) | 40 |
| base material (1 + 2) (%) | 90 |
| activator | 10 |
| amount test of white smoke | O |
| wetting extendability test | O |
| existence or no-existence of precipitation | O |
| Embodiment 6 | |
| 1: rosin ester (%) | 60 |
| 2: the other base material (%) | 25 |
| base material (1 + 2) (%) | 85 |
| activator | 15 |
| amount test of white smoke | O |
| wetting extendability test | O |
| existence or no-existence of precipitation | O |

TABLE 1-continued

| Embodiment 7 | |
|---|---|
| 1: rosin ester (%) | 80 |
| 2: the other base material (%) | 5 |
| base material (1 + 2) (%) | 85 |
| activator | 15 |
| amount test of white smoke | O |
| wetting extendability test | O |
| existence or no-existence of precipitation | O |
| Embodiment 8 | |
| 1: rosin ester (%) | 80 |
| 2: the other base material (%) | 15 |
| base material (1 + 2) (%) | 95 |
| activator | 5 |
| amount test of white smoke | O |
| wetting extendability test | O |
| existence or no-existence of precipitation | O |
| Embodiment 9 | |
| 1: rosin ester (%) | 50 |
| 2: the other base material (%) | 45 |
| base material (1 + 2) (%) | 95 |
| activator | 5 |
| amount test of white smoke | O |
| wetting extendability test | O |
| existence or no-existence of precipitation | O |
| Comparison Example 1 | |
| 1: rosin ester (%) | O |
| 2: the other base material (%) | 90 |
| base material (1 + 2) (%) | 90 |
| activator | 10 |
| amount test of white smoke | X |
| wetting extendability test | O |
| existence or no-existence of precipitation | O |
| Comparison Example 2 | |
| 1: rosin ester (%) | 30 |
| 2: the other base material (%) | 68 |
| base material (1 + 2) (%) | 98 |
| activator | 2 |
| amount test of white smoke | O |
| wetting extendability test | X |
| existence or no-existence of precipitation | O |
| Comparison Example 3 | |
| 1: rosin ester (%) | 90 |
| 2: the other base material (%) | O |
| base material (1 + 2) (%) | 90 |
| activator | 10 |
| amount test of white smoke | O |
| wetting extendability test | O |
| existence or no-existence of precipitation | X |
| Comparison Example 4 | |
| 1: rosin ester (%) | 40 |
| 2: the other base material (%) | 43 |
| base material (1 + 2) (%) | 83 |
| activator | 17 |
| amount test of white smoke | X |
| wetting extendability test | O |
| existence or no-existence of precipitation | O |
| Comparison Example 5 | |
| 1: rosin ester (%) | 50 |
| 2: the other base material (%) | 49 |
| base material (1 + 2) (%) | 99 |
| activator | 1 |
| amount test of white smoke | O |
| wetting extendability test | X |
| existence or no-existence of precipitation | O |
| Comparison Example 6 | |
| 1: rosin ester (%) | 80 |
| 2: the other base material (%) | 19 |
| base material (1 + 2) (%) | 99 |
| activator | 1 |

TABLE 1-continued

| | |
|---|---|
| amount test of white smoke | ○ |
| wetting extendability test | X |
| existence or no-existence of precipitation | ○ |
| Comparison Example 7 | |
| 1: rosin ester (%) | 20 |
| 2: the other base material (%) | 65 |
| base material (1 + 2) (%) | 85 |
| activator | 15 |
| amount test of white smoke | X |
| wetting extendability test | ○ |
| existence or no-existence of precipitation | ○ |

[Result of Amount Test of White Smoke]

It can be seen from the table that all the embodiments and the comparison examples having the good results of the white smoke amount test contain 30% or more by mass rosin ester.

No good result could obtained in the white smoke amount test for the comparison examples 1 and 7 containing less 30% by mass rosin ester. By making a comparison between the comparison example 1 and the embodiment 3 having the same amount of the activator and a comparison between the comparison example 7 and the example 1 having the same amount of the activator, it will be seen as follows:

The content ratios of the activators are the same as 10% by mass in the comparison example 1 and the embodiment 3. However, in the white smoke amount test, the comparison example 1 did not bring good results but the embodiment 3 brought good results. A difference therebetween is that the amount of the rosin ester in the comparison example 1 is 0% by mass but the embodiment 3 contains 35% by mass rosin ester.

The content ratios of the activators are the same as 15% by mass in the comparison example 7 and the embodiment 1, too. However, in the white smoke amount test, the comparison example 7 did not bring good results but the embodiment 1 brought good results. A difference therebetween is that the comparison example 7 contains 20% by mass rosin ester but the embodiment 1 contains 30% by mass rosin ester.

From these results, it can be seen that the amount of the white smoke relates to the content ratio of the rosin ester. It may be estimated that the flux containing 30% or more by mass rosin ester can suppress the amount of the white smoke during the soldering operation.

However, although the comparison example 4 contained 40% by mass rosin ester, it did not bring good results in the amount test of the white smoke. The embodiment 4, containing 40% by mass rosin ester as same as the comparison example 4, brought good results in the amount test of the white smoke. A difference between the embodiment 4 and the comparison example 4 is the content ratio of the activator and the base materials. While the embodiment 4 contained 10% by mass activator, the comparison example 4 contained 17% by mass activator. This ratio of 17% by mass is the largest amount in the embodiments and the comparison examples. As to the base materials, while the embodiment 4 contained 90% by mass, the comparison example contained 83% by mass. Therefore, it can be seen that the amount of the white smoke increases if the amount of the activator is more than 15% by mass and the amount of the base materials is less than 85% by mass.

The good results of the white smoke amount test were obtained in the embodiments 1-9, the comparison example 2, the comparison example 3, the comparison example 5 and the comparison example 6. They satisfy the conditions that the content ratio of the rosin ester is equal to or more than 30% by mass and the content ratio of the activator is equal to or less than 15% by mass. The content ratio of the base materials is equal to or more than 85% by mass in any good result case.

Judging from these results, it can be found that the good results in the white smoke amount test are obtained in the flux for the resin flux cored solder that contains 30% or more by mass rosin ester and 15% or less by mass activator. In addition, it is preferable that the flux for the resin flux cored solder contains 85% or more by mass base materials.

[Result of Wetting Extendability Test]

It can be seen from the table that ratio of the activator is equal to or more than 5% by mass and the ratio of the base material is equal to or less than 95% by mass in all the embodiments and the comparison examples having good results of the wetting extendability test.

The comparison example 2, the comparison example 5 and the comparison example 6 did not bring good results in the wetting extendability test. The content ratio of the activator is equal to or less than 5% by mass in all of these comparison examples. Moreover, the content ratio of the base materials exceeds 95% by mass. The following can be found by comparing the comparison example 2 with the embodiment 1 having the same content ratio of the rosin ester, by comparing the comparison example 5 with the embodiment 5 having the same content ratio of the rosin ester, and by comparing the comparison example 6 with the embodiment 8 having the same content ratio of the rosin ester.

Both the comparison example 2 and the embodiment 1 contain 30% by mass rosin ester. However, the comparison example 2 is different from the embodiment 1 in the content ratio of the activator. In the wetting extendability text, the embodiment 1 containing 15% by mass activator brought good results but the comparison example 2 containing the only 2% by mass activator did not bring good results.

Both the comparison example 5 and the embodiment 5 contain 50% by mass rosin ester. However, the comparison example 5 is different from the embodiment 5 in the content ratio of the activator. In the wetting extendability text, while the embodiment 5 containing 10% by mass activator brought good results but the comparison example 5 containing the only 1% by mass activator did not bring good results.

Both the comparison example 6 and the embodiment 8 contain 80% by mass rosin ester. However, the comparison example 6 is different from the embodiment 8 in the content ratio of the activator. In the wetting extendability text, the embodiment 8 containing 5% by mass activator brought good results but the comparison example 6 containing the only 1% by mass activator did not bring good results.

From these results, it is found that it is preferably to contain 5% or more by mass activator in order to accomplish the enough wettability of the solder for the soldering operation. It is preferably the content ratio of the base materials is equal to or less than 95% by mass.

Judging from the two tests, when the flux for the resin flux cored solder contains 30% or more by mass rosin ester and 5% or more by mass but 15% or less by mass activator, it can keep the wettability and inhibit the generation of the white smoke during the soldering operation. In addition, it is preferably that the content ratio of the base materials is equal to or more than 85% by mass but equal to or less than 95% by mass.

[Precipitation Test of Raw Materials]

The comparison example 3 produced the precipitation of the raw materials. The other comparison examples and the embodiments did not produce the precipitation of the raw materials. The comparison example 3 contains 90% by mass rosin ester and 10% by mass activator. The comparison example 3 is different from the other examples in that the content ratio of the rosin ester is very large such as 90% by mass. Moreover, the comparison example 3 does not contain the other base materials.

As a result, it is seen that it is preferable to contain 80% or less by mass rosin ester for suppressing the precipitation of the raw materials when manufacturing the flux.

Judging from these results, it is found that the flux for the resin flux cored solder contains preferably 30% or more by mass but 80% or less by mass rosin ester and 5% or more by mass but 15% or less by mass activator in order to suppress the white smoke generation while keeping the wettability during the soldering operation and not to precipitate the raw materials during the flux manufacturing. It is further found that the total content ratio of the base materials including the rosin ester is preferably equal to or more than 85% by mass but equal to or less than 95% by mass.

In general, the soldering operation of the resin flux cored solder is conducted when a temperature of the soldering iron is about 350° C. If the heat at the soldering operation is too high, a burnt deposit of the flux attached to the soldering iron is attached to the portion to be soldered and it causes the soldering defect. However, the resin flux cored solder using the flux of the present invention can accomplish the good soldering characteristic even if the temperature of the soldering iron is high such as 450° C. or the like.

The flux of the present invention can be applied to the flux coated solder having the surface coated with the flux in addition to the resin flux cored solder. A method of coating the surface of the solder with the flux may be a conventional well-known method using a dipping method, a spray fluxer method or the like.

In the above description, the wire solder is used for the solder as the element of the present invention. However, the present invention is not limited to a line shaped solder. In particular, the invention can be applied to a so-called preform solder that is a solder having a processed shape, such as a pellet, washer, disk or the like. The preformed solder can inhibit the white smoke from generating regardless of the resin flux cored solder that is filled with the flux or the flux coated solder that is coated with the flux.

Therefore, the present invention can be applied to the flux used for the resin flux cored solder, the resin flux cored solder using the flux, the flux used for the flux coated solder and the flux coated solder using the flux.

Although various embodiments, which incorporate the techniques of the present invention, have been shown and described in detailed herein, those skilled in the art will readily understand that many other varied embodiments may be incorporated using these techniques, and all are intended to lie within the scope of the following claims.

What is claimed is:

1. A flux for a resin flux cored solder, comprising:
30% or more by mass but 80% or less by mass rosin ester; and
5% or more by mass but 15% or less by mass activator;
wherein the total content ratio of base materials including said rosin ester is equal to or more than 85% by mass but equal to or less than 95% by mass based on the total amount of the flux, and
wherein said base materials consist of said rosin ester in solid form at ambient temperature and one or more other resins selected from the group consisting of hydrogenated rosin, acid modified rosin, polymerized rosin, high molecular compound, and combinations thereof.

2. A resin flux cored solder wherein a wire solder is filled with a flux,
said flux comprising:
30% or more by mass but 80% or less by mass rosin ester; and
5% or more by mass but 15% or less by mass activator;
wherein the total content ratio of base materials including said rosin ester is equal to or more than 85% by mass but equal to or less than 95% by mass based on the total amount of the flux, and
wherein said base materials consist of said rosin ester in solid form at ambient temperature and one or more other resins selected from the group consisting of hydrogenated rosin, acid modified rosin, polymerized rosin, high molecular compound, and combinations thereof.

3. A flux for a flux coated solder, comprising:
30% or more by mass but 80% or less by mass rosin ester; and
5% or more by mass but 15% or less by mass activator;
wherein the total content ratio of base materials including said rosin ester is equal to or more than 85% by mass but equal to or less than 95% by mass based on the total amount of the flux, and
wherein said base materials consist of said rosin ester in solid form at ambient temperature and one or more other resins selected from the group consisting of hydrogenated rosin, acid modified rosin, polymerized rosin, high molecular compound, and combinations thereof.

4. A flux coated solder wherein a wire solder is coated with a flux,
said flux comprising:
30% or more by mass but 80% or less by mass rosin ester; and
5% or more by mass but 15% or less by mass activator;
wherein the total content ratio of base materials including said rosin ester is equal to or more than 85% by mass but equal to or less than 95% by mass based on the total amount of the flux, and
wherein said base materials consist of said rosin ester in solid form at ambient temperature and one or more other resins selected from the group consisting of hydrogenated rosin, acid modified rosin, polymerized rosin, high molecular compound, and combinations thereof.

* * * * *